US007943244B2

(12) United States Patent
Aziz et al.

(10) Patent No.: US 7,943,244 B2
(45) Date of Patent: May 17, 2011

(54) DISPLAY DEVICE WITH METAL-ORGANIC MIXED LAYER ANODES

(75) Inventors: Hany Aziz, Oakville (CA); Nemanja Stefanovic, Toronto (CA); Jennifer A. Coggan, Cambridge (CA); Anthony J. Paine, Mississauga (CA); Zoran D. Popovic, Mississauga (CA)

(73) Assignee: LG Display Co., Ltd., Seoul (KR)

( * ) Notice: Subject to any disclaimer, the term of this patent is extended or adjusted under 35 U.S.C. 154(b) by 362 days.

(21) Appl. No.: 11/133,977

(22) Filed: May 20, 2005

(65) Prior Publication Data

US 2006/0263628 A1 Nov. 23, 2006

(51) Int. Cl.
*H01L 51/54* (2006.01)

(52) U.S. Cl. ........ 428/690; 428/917; 313/504; 313/506; 252/301.16; 257/40; 257/101; 257/102; 257/E51.019

(58) Field of Classification Search .................. 428/690, 428/917; 427/58, 66; 313/502–509; 257/40, 257/88–103, E51.001–E51.052; 252/301.16–301.35
See application file for complete search history.

(56) References Cited

U.S. PATENT DOCUMENTS

| | | |
|---|---|---|
| 2,823,905 A | 2/1958 | Brown |
| 3,172,862 A | 3/1965 | Gurnee et al. |
| 3,598,644 A | 8/1971 | Goffe et al. |
| 4,084,966 A | 4/1978 | Haas et al. |
| 4,287,449 A | 9/1981 | Takeda et al. |
| 4,356,429 A | 10/1982 | Tang |
| 4,539,507 A | 9/1985 | VanSlyke et al. |
| 4,652,794 A | 3/1987 | Waite et al. |
| 4,665,115 A | 5/1987 | Lundberg et al. |
| 4,720,432 A | 1/1988 | VanSlyke et al. |
| 4,769,292 A | 9/1988 | Tang et al. |
| 4,885,211 A | 12/1989 | Tang et al. |
| 5,049,780 A | 9/1991 | Dombrowolski et al. |
| 5,059,861 A | 10/1991 | Littman et al. |
| 5,141,671 A | 8/1992 | Bryan et al. |
| 5,150,006 A | 9/1992 | Van Slyke et al. |
| 5,151,629 A | 9/1992 | VanSlyke |
| 5,227,252 A | 7/1993 | Murayama et al. |
| 5,247,190 A | 9/1993 | Friend et al. |
| 5,276,381 A | 1/1994 | Wakimoto et al. |
| 5,409,783 A | 4/1995 | Tang et al. |
| 5,429,884 A | 7/1995 | Namiki et al. |
| 5,457,565 A | 10/1995 | Namiki et al. |
| 5,516,577 A | 5/1996 | Matsuura et al. |
| 5,593,788 A | 1/1997 | Shi et al. |
| 5,601,903 A | 2/1997 | Fujii et al. |
| 5,608,287 A | 3/1997 | Hung et al. |
| 5,703,436 A | 12/1997 | Forrest et al. |
| 5,707,745 A | 1/1998 | Forrest et al. |
| 5,719,467 A | 2/1998 | Antoniadis et al. |
| 5,728,801 A | 3/1998 | Wu et al. |
| 5,739,635 A | 4/1998 | Wakimoto |
| 5,776,622 A | 7/1998 | Hung et al. |
| 5,837,391 A | 11/1998 | Utsugi |
| 5,846,666 A | 12/1998 | Hu et al. |
| 5,853,905 A | 12/1998 | So et al. |
| 5,925,472 A | 7/1999 | Hu et al. |
| 5,925,980 A | 7/1999 | So et al. |
| 5,935,720 A | 8/1999 | Chen et al. |
| 5,935,721 A | 8/1999 | Shi et al. |
| 5,942,340 A | 8/1999 | Hu et al. |
| 5,952,115 A | 9/1999 | Hu et al. |
| 5,955,836 A | 9/1999 | Boerner et al. |
| 5,972,247 A | 10/1999 | Shi et al. |
| 6,013,384 A | 1/2000 | Kido et al. |
| 6,023,073 A | 2/2000 | Strite |
| 6,028,327 A | 2/2000 | Mizoguchi et al. |
| 6,057,048 A | 5/2000 | Hu et al. |
| 6,105,202 A | 8/2000 | Grasso et al. |
| 6,107,734 A | 8/2000 | Tanaka et al. |
| 6,130,001 A | 10/2000 | Shi et al. |
| 6,225,467 B1 | 5/2001 | Hu et al. |
| 6,229,012 B1 | 5/2001 | Hu et al. |
| 6,274,980 B1 | 8/2001 | Burrows |
| 6,303,250 B1 | 10/2001 | Watanabe et al. |

(Continued)

FOREIGN PATENT DOCUMENTS

EP 0 831 676 3/1998

(Continued)

OTHER PUBLICATIONS

Endo et al., "Organic Electroluminescent Devices with a Vacuum-Deposited Lewis-Acid-Doped Hole-Injecting Layer," Japanese Journal of Applied Physics, vol. 21, No. 3B, pp. L358-L360, Mar. 2002.*
Day et al., "The use of charge transfer interlayers to control hole injection in molecular organic light emitting diodes," Thin Solid Films, vol. 410, No. 1-2, pp. 159-166, May 2002.*
Grandin et al. "Light-Absorption Phenomena in Novel Low-Reflectance Cathodes for Organic Light-Emitting Devices Utilizing Metal-Organic Mixtures," Advanced Materials, vol. 15, No. 23, pp. 2021-2024, Dec. 2003.*
Gao et al. "Controlled p doping of the hole-transport molecular material N,N[sup ']-diphenyl-N,N'-bis(1-naphthyl)-1,1'-biphenyl-4,4'-diamine with tetrafluorotetracyanoquinodimethane," Journal of Applied Physics, vol. 94, No. 1, pp. 359-366, Jul. 2003.*
Blochwitz et al. "Non-polymeric OLEDs with a doped amorphous hole transport layer and operating voltages down to 3.2 V to achieve 100 cd/m2." Synth. Metals 2002, vol. 127 pp. 169-173.*

(Continued)

*Primary Examiner* — D. Lawrence Tarazano
*Assistant Examiner* — Michael H Wilson
(74) *Attorney, Agent, or Firm* — McKenna Long & Aldridge LLP

(57) ABSTRACT

A display device comprises an anode, a cathode, and a luminescent region disposed between the anode and the cathode, wherein the anode comprises a metal-organic mixed layer operatively combined with an electron-accepting material. An anode may comprise a mixture of a metal-organic mixed layer and an electron-accepting material within a single layer of the anode. Alternatively, the anode may have a multilayer configuration comprising a metal-organic mixed layer and a buffer layer adjacent the metal-organic mixed layer, wherein the buffer layer comprises an electron-accepting material and optionally a hole transport material.

10 Claims, 1 Drawing Sheet

U.S. PATENT DOCUMENTS

| | | | |
|---|---|---|---|
| 6,392,250 B1 | 5/2002 | Aziz et al. |
| 6,392,339 B1 | 5/2002 | Aziz et al. |
| 6,423,429 B2 | 7/2002 | Kido et al. |
| 6,437,123 B1 | 8/2002 | Bock et al. |
| 6,465,115 B2 | 10/2002 | Shi et al. |
| 6,479,172 B2 | 11/2002 | Hu et al. |
| 6,562,485 B2 | 5/2003 | Hu et al. |
| 6,565,996 B2 | 5/2003 | Hatwar et al. |
| 6,614,175 B2 | 9/2003 | Aziz et al. |
| 6,639,357 B1 | 10/2003 | Parthasarathy et al. |
| 6,717,358 B1 | 4/2004 | Liao |
| 6,734,625 B2 | 5/2004 | Vong et al. |
| 6,737,177 B2 | 5/2004 | Aziz et al. |
| 6,740,429 B2 | 5/2004 | Aziz et al. |
| 6,750,609 B2 | 6/2004 | Aziz et al. |
| 6,753,098 B2 | 6/2004 | Aziz et al. |
| 6,759,146 B2 | 7/2004 | Aziz et al. |
| 6,765,348 B2 | 7/2004 | Aziz et al. |
| 6,773,830 B2 | 8/2004 | Aziz et al. |
| 6,821,643 B1 | 11/2004 | Hu et al. |
| 6,841,932 B2 | 1/2005 | Aziz et al. |
| 7,083,490 B2 | 8/2006 | Mueller et al. |
| 7,211,948 B2 | 5/2007 | Liao et al |
| 7,288,887 B2 | 10/2007 | Aziz et al. |
| 7,291,404 B2 | 11/2007 | Aziz et al. |
| 7,351,999 B2 | 4/2008 | Li |
| 7,420,203 B2 | 9/2008 | Tsutsui et al. |
| 7,473,923 B2 | 1/2009 | Tsutsui et al. |
| 2002/0037398 A1 | 3/2002 | Tofuku et al. |
| 2002/0121860 A1 | 9/2002 | Seo et al. |
| 2002/0135296 A1 | 9/2002 | Aziz et al. |
| 2002/0145380 A1 | 10/2002 | Aziz et al. |
| 2002/0180349 A1 | 12/2002 | Aziz et al. |
| 2003/0071565 A1 | 4/2003 | Hatwar et al. |
| 2003/0116772 A1 | 6/2003 | Yamazaki et al. |
| 2003/0127967 A1 | 7/2003 | Tsutsui et al. |
| 2003/0134146 A1 | 7/2003 | Aziz et al. |
| 2003/0170491 A1 | 9/2003 | Liao et al. |
| 2003/0189401 A1 | 10/2003 | Kido et al. |
| 2003/0230974 A1 | 12/2003 | Chang et al. |
| 2003/0234609 A1 | 12/2003 | Aziz et al. |
| 2004/0004433 A1 | 1/2004 | Lamansky et al. |
| 2004/0009418 A1 | 1/2004 | Main et al. |
| 2004/0018383 A1 | 1/2004 | Aziz et al. |
| 2004/0027059 A1 | 2/2004 | Tsutsui |
| 2004/0209184 A1 | 10/2004 | Hatakeyama et al. |
| 2004/0227460 A1 | 11/2004 | Liao et al. |
| 2004/0262615 A1 | 12/2004 | Cok |
| 2005/0064235 A1 | 3/2005 | Liao et al. |
| 2005/0100760 A1 | 5/2005 | Yokoyama |
| 2005/0112400 A1 | 5/2005 | Seo et al. |
| 2005/0140275 A1 | 6/2005 | Park |
| 2005/0175857 A1 | 8/2005 | Coggan et al. |
| 2006/0105202 A1 | 5/2006 | Kitamura |
| 2006/0139516 A1 | 6/2006 | Park |
| 2006/0139893 A1 | 6/2006 | Yoshimura et al. |
| 2006/0194076 A1 | 8/2006 | Nariyuki |
| 2006/0251919 A1 | 11/2006 | Aziz et al. |
| 2006/0251920 A1 | 11/2006 | Aziz et al. |
| 2006/0261727 A1 | 11/2006 | Aziz et al. |
| 2006/0261731 A1 | 11/2006 | Aziz et al. |
| 2006/0263593 A1 | 11/2006 | Aziz et al. |
| 2006/0263628 A1 | 11/2006 | Aziz et al. |
| 2006/0263629 A1 | 11/2006 | Aziz et al. |
| 2006/0265278 A1 | 11/2006 | Dimeo |
| 2007/0182317 A1 | 8/2007 | Kido et al. |
| 2009/0045738 A1 | 2/2009 | Tsutsui et al. |

FOREIGN PATENT DOCUMENTS

| | | |
|---|---|---|
| EP | 0855848 | 7/1998 |
| EP | 0 977 287 A2 | 2/2000 |
| EP | 0 977 288 A2 | 2/2000 |
| EP | 1 009 044 A2 | 6/2000 |
| EP | 1 010 359 B1 | 6/2000 |
| EP | 1 017 118 | 7/2000 |
| EP | 1 029 832 A1 | 8/2000 |
| EP | 1 160 890 A2 | 12/2001 |
| EP | 1 167 488 | 1/2002 |
| EP | 1 311 139 A1 | 5/2003 |
| EP | 1 339 112 A2 | 8/2003 |
| EP | 1 408 563 | 4/2004 |
| EP | 1 624 504 A2 | 8/2005 |
| EP | 1 624 503 A2 | 2/2006 |
| JP | 04-230997 | 8/1992 |
| JP | 1993-217675 | 8/1993 |
| JP | 06-176870 | 6/1994 |
| JP | 8-222374 A | 8/1996 |
| JP | 09-188875 | 7/1997 |
| JP | 10-316904 A | 12/1998 |
| JP | 11-251067 | 9/1999 |
| JP | 11-312584 | 11/1999 |
| JP | 11-329749 | 11/1999 |
| JP | 2002-055203 A | 2/2002 |
| JP | 2003-045676 | 2/2003 |
| JP | 2003-086381 | 3/2003 |
| JP | 2003-151777 | 5/2003 |
| JP | 2004-039617 | 2/2004 |
| JP | 2004-095546 | 3/2004 |
| JP | 2004-139981 | 5/2004 |
| JP | 2004-317897 A | 11/2004 |
| JP | 2005-032618 | 2/2005 |
| JP | 2005-070574 | 3/2005 |
| JP | 2005-070754 | 3/2005 |
| JP | 2005-072012 | 3/2005 |
| JP | 2006-173550 | 6/2006 |
| JP | 2006-210845 | 8/2006 |
| WO | WO 96/19792 | 6/1996 |
| WO | WO 97/33296 A1 | 9/1997 |
| WO | WO 98/41065 A1 | 9/1998 |
| WO | WO 99/03158 | 1/1999 |
| WO | WO 00/30139 | 5/2000 |
| WO | WO 01/06816 A1 | 1/2001 |
| WO | WO 01/08240 A1 | 2/2001 |
| WO | WO 03/055275 | 7/2003 |
| WO | WO 03/088718 A1 | 10/2003 |
| WO | WO/2004/068911 | 8/2004 |
| WO | WO 2005/037954 | 4/2005 |
| WO | WO 2006/033472 A1 | 3/2006 |
| WO | WO 2006/038573 A1 | 4/2006 |
| WO | WO 2006/076092 | 7/2006 |

OTHER PUBLICATIONS

Hyun-Ouk Ha et al., "Improving the efficiency of organic electroluminescent devices by introducing an electron-accepting and thermally stable polymer", Optical Materials, vol. 21 pp. 165-168 (2002).

Liu et al., "Development of highly stable organic electroluminescent devices with a doped co-host emitter system", Current Applied Physics 5, pp. 218-221 (2005).

Aziz et al., "Reduced reflectance cathode for organic light-emitting devices using metalorganic mixtures", Applied Physics Letters, vol. 83, No. 1, pp. 186-188 (2003).

A. Gyoutoku et al., "An Organic Electroluminescent Dot-Matrix Display Using Carbon Underlayer", Synthetic Metals, vol. 91, pp. 73-75 (1997).

Baldo et al., "Highly efficient phosphorescent emission from organic electroluminescent devices," Letters to Nature, vol. 395, pp. 151-154 (1998).

Bernius et al., "Developmental Progress of Electroluminescent Polymeric Materials and Devices" Proceedings of SPIE Conference on Organic Light Emitting Materials and Devices III, Denver, Colo., vol. 3797, p. 129-137 (Jul. 1999).

Carter et al., "Polymeric anodes for improved polymer light-emitting diode performance", Appl. Phys. Lett. 70 (16), pp. 2067-2069 (Apr. 21, 1997).

Chengfeng Qiu et al., Comparative Study of Metal or Oxide Capped Indium-Tin Oxide Anodes for Organic Light-Emitting Diodes, Journal of Applied Physics, vol. 93, No. 6 pp. 3253-3257 (Mar. 15, 2003).

Chengfeng Qiu et al., "Praseodymium Oxide Coated Anode for Organic Light-Emitting Diode", Applied Physics Letters, vol. 80, No. 19, pp. 3485-3487 (May 13, 2002).

Chieh-Wei Chen et al., "Top-Emitting Organic Light-Emitting Devices Using Surface-Modified Ag Anode," Applied Physics Letters, vol. 83, No. 25, pp. 5127-5129 (Dec. 22, 2003).

Endo et al., "Organic Electroluminescent Devices with a Vacuum-Deposited Lewis-Acid-Doped Hole-Injecting Layer", Japanese Journal of Applied Physics, vol. 41, pp. L358-L360 (Mar. 2002).

Hongjin Jiang et al., "Improvement of Organic Light-Emitting Diodes Performance by the Insertion of a $Si_3N_4$ Layer", Thin Solid Films, vol. 363, pp. 25-29 (2000).

I-Min Chan et al., "Enhanced Hole Injections in Organic Light-Emitting Devices by Depositing Nickel Oxide on Indium Tin Oxide Anode," Applied Physics Letters, vol. 81, No. 10, pp. 1899-1901 (Sep. 2, 2002).

Kedo et al., "White-Light-Emitting Organic Electroluminescent Device Using Lanthanide Complexes," Jpn. J. Appl. Phys., vol. 35, pp. L394-L396 (1996).

Kim et al., "Molecular organic light-emitting diodes using highly conducting polymers as anodes", Appl. Phys. Lett., vol. 80 No. 20, pp. 3844-3846 (May 20, 2002).

S. A. VanSlyke et al., "Organic Electroluminescent Devices with Improved Stability", Applied Physics Letters, vol. 69, No. 15, pp. 2160-2162 (Oct. 7, 1996).

S. Karg et al., "Increased Brightness and Lifetime of Polymer Light Emitting Diodes with Polyanilne Anodes", Synthetic Metals, vol. 80, pp. 111-117 (1996).

Soo-Jin Chua et al., "Stabilization of Electrode Migration in Polymer Electroluminescent Devices", Applied Physics Letters, vol. 81, No. 6, pp. 1119-1121 (Aug. 5, 2002).

Wenping Hu et al., "Lowering of Operational Voltage of Organic Electroluminescent Devices by Coating Indium Tin Oxide Electrodes with a Thin $CuO_x$ Layer", Applied Physics Letters, vol. 80, No. 15, pp. 2640-2641 (Apr. 15, 2002).

Yulong Shen et al., "Modification of Indium Tin Oxide for Improved Hole Injection in Organic Light Emitting Diodes," Advanced Materials, vol. 13, No. 16 pp. 1234-1238 (Aug. 16, 2001).

Z.B. Deng et al., "Enhanced Brightness and Efficiency in Organic Electroluminescent Devices Using $SiO_2$ Buffer Layers", Applied Physics Letters, vol. 74, No. 15, pp. 2227-2229 (Apr. 12, 1999).

Zugang et al., "Organic thin film electroluminescent devices with ZnO:Al as the anode", J. Phys.: Condens. Matter 8, pp. 3221-3228 (1996).

Choong et al.; "Organic Light Emitting Diodes With a Bipolar Transport Layer"; Applied Physics Letters; vol. 75, No. 2, Jul. 12, 1999, pp. 172-174.

Matsumoto, Toshio et al., Multiphoton Emission OLED: Structure and Property, IDW'03; Dec. 2003, pp. 1285-1288.

Kim et al., "Anode material based on Zr-doped ZnO thin films for organic light-emitting diodes", Appl. Phys. Lett., vol. 83, No. 18, pp. 3809-3811, 2003.

Hung et al., Anode modification in organic light-emitting diodes by low-frequency plasma polymerization of $CHF_3$, Applied Physics Letters, vol. 78, No. 5, pp. 673-675, 2001.

* cited by examiner

DISPLAY DEVICE WITH METAL-ORGANIC MIXED LAYER ANODES

INCORPORATION BY REFERENCE

Co-pending application Ser. No. 11/133,978 describes stacked OLEDs that may comprise as an intermediate electrode a metal-organic mixed layer in combination with an electron-accepting material.

BACKGROUND

The present disclosure relates, in various exemplary embodiments, to display devices comprising a metal-organic mixed layer as part of an anode configuration. In particular, the present disclosure relates to display devices comprising a metal-organic mixed layer as part of an anode and operatively combined with an electron-accepting material. While the anode configurations are described with particular reference to organic light emitting devices (OLEDs), it will be appreciated that the anodes are amendable to other similar applications and display devices.

Organic light emitting devices (OLEDs) represent a promising technology for display applications. A typical organic light emitting device includes a first electrode; a luminescent region comprising one or more electroluminescent organic material(s); and a second electrode; wherein one of the first electrode and the second electrode functions as a hole-injecting anode, and the other electrode functions as an electron-injecting cathode; and wherein one of the first electrode and the second electrode is a front electrode, and the other electrode is a back electrode. The front electrode is transparent (or at least partially transparent) while the back electrode is usually highly reflective to light. When a voltage is applied across the first and second electrodes, light is emitted from the luminescent region and through the transparent front electrode. When viewed under high ambient illumination, the reflective back electrode reflects a substantial amount of the ambient illumination to the observer, which results in higher ratios of reflected illumination as compared to the device's own emission resulting in "washout" of the displayed image.

In order to improve the contrast of electroluminescent displays in general, light-absorbing layers as described, for example, in U.S. Pat. No. 4,287,449, or optical interference members as described, for example, in U.S. Pat. No. 5,049,780, have been used to reduce the ambient illumination reflection.

Other recent developments in reducing the reflection of ambient light in display devices have been directed to metal-organic mixed layers such as described in, for example, U.S. patent application Ser. No. 10/117,812, now U.S. Pat. No. 6,841,932, and U.S. patent application Ser. No. 10/401,238, which is published as U.S. Pat. Publication No. 2003/0234609. Other methods to reduce light reflection are addressed in U.S. Pat. No. 6,750,609. These applications and patents are incorporated herein by reference in their entirety.

Anodes in display devices such as OLEDs are typically formed from materials such as ITO. The use of ITO has disadvantages, however, in that ITO cannot be readily fabricated by thermal vapor deposition techniques commonly used to make or form the other components of the OLED. An ITO anode usually requires more aggressive fabrication techniques such as sputtering and is therefore fabricated separately from the rest of the OLED to avoid damaging the relatively fragile organic stack and components of the adjacent layers. This results in an increase in both the time and cost required to manufacture or form a OLED structure.

There is thus a need to provide a material or configuration for an anode that allows the anode to be formed using deposition techniques that are used to form the other layers of the OLED.

Additionally, non-reflective anodes (black anodes) are important for top-emitting devices in which the driving electronic circuitry is located on the anode side instead of the cathode side of the display device as in the case of regular bottom-emitting OLEDs. While metal-organic mixed layers as described in the afore mentioned patents and applications, have been demonstrated as suitable for a cathode, material incompatibility issues have posed problems for their use as non-reflective or black anodes.

Therefore, there is a need for new anode materials and/or configurations. A need exists for anode configurations and materials that are amenable to less aggressive deposition techniques such as, for example, thermal deposition. There is also a need for an anode configuration that allows for tuning the transparency or opacity of the anode to be controlled such that the anode and/or OLED may be made substantially reflective, substantially light absorbing (e.g. black), or substantially transmissive (e.g. transparent or semitransparent), as desired.

BRIEF DESCRIPTION

The present disclosure relates, in embodiment thereof, to a display device comprising an anode; a cathode; and a luminescent region disposed between the anode and the cathode, wherein the anode comprises a metal-organic mixed layer operatively combined with an electron-accepting material.

The present disclosure also relates, in various embodiments thereof, to a display device comprising an anode; a cathode; and a luminescent region disposed between the anode and the cathode, wherein the anode comprises a mixture of a metal-organic mixed layer and an electron-accepting material, the metal-organic mixed layer comprising i) a metal material, and ii) an organic material.

Additionally, the present disclosure relates, in embodiments thereof, to a display device comprising an anode; a cathode; and a luminescent region disposed between the anode and the cathode, wherein the anode comprises a metal-organic mixed layer and a buffer layer, the metal-organic mixed layer comprising i) a metal material, and ii) an organic material, and the buffer layer comprising an electron-accepting material.

The present disclosure also relates, in further embodiments thereof, to a display device comprising an anode, a cathode, and a luminescent region disposed between the anode and the cathode wherein the anode comprises a metal-organic mixed layer, and a buffer layer, the buffer layer comprising an electron-accepting material and optionally a hole transport material.

These and other non-limiting features and characteristics are further disclosed herein.

BRIEF DESCRIPTION OF THE DRAWINGS

The following is a brief description of the drawings, which are presented for the purpose of illustrating exemplary embodiments disclosed herein and not for the purpose of limiting the same.

DETAILED DESCRIPTION

The present disclosure relates to display devices such as, for example, OLEDs. A display device in accordance with the present disclosure includes an anode, a cathode, and a luminescent region disposed between the anode and the cathode. An anode in accordance with the present disclosure comprises a metal-organic mixed layer (MOML) operatively combined with an electron-accepting material.

Figure 1:
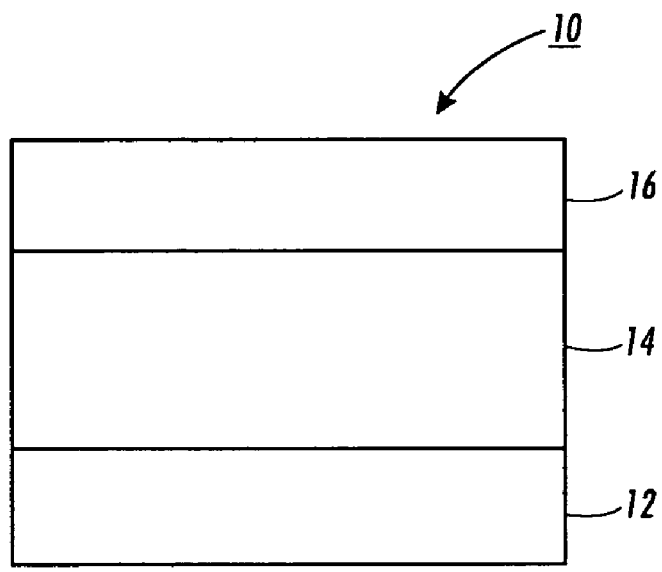
FIG. 1 is a schematic cross sectional view of one embodiment of a display device in accordance with the present disclosure.

With reference to FIG. 1, an OLED 10 comprises an anode 12, a cathode 16, and a luminescent region 14 disposed between anode 12 and cathode 16. Anode 12 comprises a mixture of a MOML and an electron-accepting material.

Figure 2:
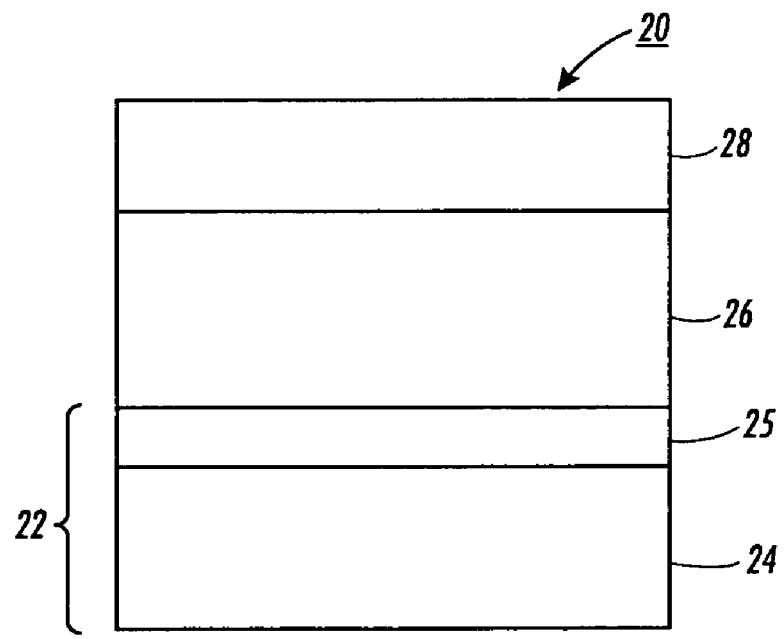
FIG. 2 is a schematic cross sectional view of another embodiment of a display device in accordance with the present disclosure.

With reference to FIG. 2, OLED 20 comprises anode 22, a luminescent region 26, and a cathode 28. Anode 22 comprises MOML 24 and buffer layer or region 25. Buffer layer or region 25 comprises an electron-accepting material, and the MOML 24 is considered to be operatively combined with the electron-accepting material of buffer layer 25.

To avoid confusion in understanding the scope of the present disclosure, the following guidelines can be used; (1) the term "layer" indicates a single coating generally having a composition that differs from the composition of an adjacent layer; (2) the term "region" refers to a single layer, a plurality of layers such as two, three or more layers, and/or one or more "zones"; (3) the term "zone," as used in the context of, for example, the charge transport zone (i.e., hole transport zone and electron transport zone) or the light emitting zone, refers to a single layer, a plurality of layers, a single functional area in a layer, or a plurality of functional areas in a layer; (4) generally, all regions and layers of the display device that are between the two electrodes or that participate in the charge conduction processes needed to operate the display device are considered part of either the cathode, luminescent region, or anode; (5) generally, a layer (e.g., substrate) that does not participate in the charge conduction processes of the display device and that can be viewed as being outside of the two electrodes shall not be considered part of the electrodes; such a layer (e.g., substrate), however, still may be considered a part of the display device; (6) a capping region (which protect an electrode from the ambient environment), however, is considered part of the electrode regardless whether the capping region participates in the charge conduction processes of the display device; (7) any region or layer (e.g., electron injection region and hole injection region) that injects charge into the luminescent region is considered part of the electrode; (8) if a MOML can be equally viewed as part of the electrode or the luminescent region, the convention is that the MOML is part of the electrode; (9) in embodiments containing a plurality of adjacent (i.e., contacting) MOMLs, if some or all of the MOMLs can be equally viewed as part of the electrode or the luminescent region, the convention is that the MOMLs are considered part of the electrode; (10) impurities (which may be present in small amounts in the two, three, four, or more material components making up the MOML) are generally not considered a designated component of the MOML; for example, the presence of impurities in a "Binary MOML" composed of the two designated components of the inorganic metal containing material and the organic compound would not change the designation of the MOML as being a "Binary MOML"; and (11) "light emitting region" and "luminescent region" are used interchangeably.

The anode comprises a MOML operatively combined with an electron-accepting material. A MOML is operatively combined with an electron-accepting material where (i) the MOML is mixed with an electron-accepting material in a single layer or composition, or (ii) the MOML and electron-accepting material are not physically combined but exist in separate, adjacent layers.

A MOML comprises a metal material and an organic material. A metal material as used herein includes, but is not limited to, elemental metals and metal compounds such as, for example, inorganic compounds (e.g., metal oxides, metal halides, etc.). While aspects of a MOML are described below, MOMLs are further described in U.S. Pat. No. 6,841,932 and U.S. patent application Ser. No. 10/401,238, which is published as U.S. Pat. Application Publication No. 2003/0234609, the disclosures of which are incorporated herein by reference in their entirety. It will be appreciated that an anode in display device in accordance with the present disclosure may include a MOML chosen from any of the embodiments depicted in those references.

Suitable metal materials for the MOML include, for example, metals and inorganic metal compounds. As used herein, the phrase "metal of the metal material" (where such phrase precedes a list of specific elemental metals) refers to both elemental metals and the metal component of inorganic metal compounds. The metals can be, but are not limited to, for example, Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, Eu, and combinations thereof. In embodiments the term "metals" includes Sb, Se, and Te. In embodiments, a metal alloy can be used to form the MOML. One metal of the metal alloy is considered the metal material; the other metal or metals of the metal alloy are considered the additional component or components of the MOML. For instance, a binary metal alloy in combination with the organic material would be considered a Ternary MOML.

The inorganic metal compounds for the MOML may be a metal halide (e.g., fluoride, chloride, bromide, iodide), metal oxide, metal hydroxide, metal nitride, metal sulfide, metal carbide, metal boride, and the like. Suitable metal halides can be, but are not limited to, for example, LiF, LiCl, LiBr, LiI, NaF, NaCl, NaBr, NaI, KF, KCl, KBr, KI, RbF, RbCl, CsF, CsCl, $MgF_2$, $CaF_2$, $SrF_2$, $AlF_3$, AgCl, AgF, and $CuCl_2$. Suitable metal oxides can be, but are not limited to, $Li_2O$, $Ca_2O$, $Cs_2O$, $In_2O_3$, $SnO_2$, ZnO, ITO, $Cu_2O$, CuO, $Ag_2O$, NiO, TiO, $Y_2O_3$, $ZrO_2$, $Cr_2O_3$. A suitable metal hydroxide can be, but is not limited to, for example, AgOH. Examples of suitable metal nitrides include, but are not limited to, LaN, YN and GaN. Suitable metal sulfides can be, but are not limited to, ZnS, $Sb_2S_3$, $Sb_2S_5$, and CdS. A suitable metal carbide can be, but is not limited to, $Li_2C$, FeC and NiC. A suitable metal boride can be, but is not limited to $CaB_6$.

Inorganic materials for the MOML include for example; (i) elemental non-metal materials such as C, Si, and Ge; (ii) inorganic compounds of these elemental non-metal materials such as SiC, SiO, $SiO_2$, $Si_3N_4$; and (iii) inorganic metal compounds such as those described herein. Since there is a separate component category for metals (in the list of components for the MOML), metals are not classified as inorganic materials.

As described herein, some metal compounds are known to be electrically conductive and light absorbing. Mixtures of organic compounds and these metal compounds therefore, in embodiments, may be able to realize certain desired features of a display device in accordance with the present disclosure, such as, for example, reducing the reflectance of the device. In embodiments, the inorganic metal containing material for use in the MOML may be a metal compound, particularly metal compounds that may be both electrically conductive and light absorbing such as, for example, $Ag_2O$, $Cu_2O$, CuO, FeO, $Fe_2O_3$, $Fe_3O_4$, NiO, $V_2O_5$, ZnS, ZnO, $In_2O_3$, $SnO_2$, and the like.

Suitable organic materials for the MOML can be for example electroluminescent materials utilized in fabricating the luminescent region of the display device, such electroluminescent materials being described herein. For example, suitable organic materials for the MOML can include molecular (small-molecule) organic compounds such as metal oxinoids, metal chelates, tertiary aromatic amines, indolocarbazoles, porphyrins, phthalocyanines, triazines, anthracenes, and oxadiazoles; and polymeric compounds such as polythiophenes, polyfluorenes, polyphenylenes, polyanilenes, and polyphenylenevinylens. Other organic compounds that can also be used in the MOML include poly-polycarbonates, polyethylenes, polystyrenes, organic dyes and pigments (e.g., perinones, coumarines, and other fused aromatic ring compounds).

One class of organic materials that can be utilized in a MOML includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate) aluminum (AlQ3), and bis(8-hydroxyquinolato)-(4-phenylphenolato) aluminum (BAlq). Other examples of this class of materials include tris(8-hydroxyquinolinate) gallium, bis(8-hydroxyquinolinate) magnesium, bis(8-hydroxyquinolinate) zinc, tris(5-methyl-8-hydroxyquinolinate) aluminum, tris(7-propyl-8-quinolinolato) aluminum, bis[benzo{f}-8-quinolinate]zinc, bis(10-hydroxy-benzo[h]quinolinate) beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}8-quinolinethiolato]zinc, bis[3-methylbenzo{f}-8-quinolinethiolato]zinc, bis[3,7-dimethyl-benzo{f}8-quinolinethiolato]zinc, and the like. Exemplary materials are bis(8-quinolinethiolato)zinc, bis(8-quinolinethiolato)cadmium, tris(8-quinoline-thiolato)gallium, tris(8-quinolinethiolato)indium and bis[benzo{f}-8-quinoline-thiolato]zinc.

As discussed herein, the MOML can be a "Binary MOML" (with two components), a "Ternary MOML" (with three components), "Quaternary MOML" (with four components), or other MOMLs with more than four components. In these embodiments, the selection of the inorganic metal containing material, the organic compound and any other additional components is made on the basis that the MOML should have the desired property or properties. In addition to being light reflection-reducing, the MOML can optionally possess one or more additional desired properties including for example being electrically conductive and any other properties that the MOML may need to have in order to serve other functions as may be required by the location of the MOML in the display device (such as the need to also be capable of injecting charge efficiently if the MOML is the part of an electrode that is adjacent the luminescent region). In cases when the display device includes a plurality of MOMLs, the MOMLs can be of the same or different material composition (with respect to the components and their concentrations).

It is noted that the lists of suitable materials for the components in a particular MOML type may overlap. For example, in a "Ternary MOML," suitable materials for the second component (i.e., an organic material) are the same as the choice of "organic materials" for the third component. In addition, in a "Ternary MOML," suitable materials for the first component (i.e., a metal material) overlap with the choice of "metals" and "inorganic materials" for the third component. However, no inconsistency is present even if the lists of suitable materials for the components in a particular MOML type overlap as long as the selected components of the MOML type are different from one another, i.e., each selected component is unique.

In one embodiment, the MOML may be a Binary MOML. The phrase "Binary MOML" refers to a metal-organic mixed layer composed of two components; (i) a metal material, and (ii) an organic material. Exemplary embodiments of such a Binary MOML can include, but are not limited to, a MOML composed of Ag or an inorganic compound thereof (e.g., an oxide, hydroxide, halide, sulfide, nitride, carbide, boride, and the like) and an organic compound; a MOML composed of a Group 11 metal (such as Cu, Ag or Au) or an inorganic compound thereof (e.g., an oxide, hydroxide, halide, sulfide, nitride, carbide, boride, and the like) and an organic compound; a MOML composed of a Group 10 metal (such as Ni, Pd or Pt) or an inorganic compound thereof (e.g., an oxide, hydroxide, halide, sulfide, nitride, carbide, boride, and the like) and an organic compound; a MOML composed of a Group 13 metal (such as In) or an inorganic compound thereof (e.g., an oxide, hydroxide, halide, sulfide, nitride, carbide, boride, and the like) and an organic compound; a MOML composed of a Group 4 metal (such as Ti) or an inorganic compound thereof (e.g., an oxide, hydroxide, halide, sulfide, nitride, carbide, boride, and the like) and an organic compound; a MOML composed of a metal or an inorganic compound thereof (e.g., an oxide, hydroxide, halide, sulfide, nitride, carbide, boride, and the like) and an organic compound with significant optical absorption in the 400-700 nm wavelength range of the spectrum (e.g., an organic dye compound); a MOML composed of a Group 16 metal (i.e., Se and Te) or an inorganic compound thereof (e.g., an oxide, hydroxide, halide, sulfide, nitride, carbide, boride, and the like) and an organic compound; and the like.

In other embodiments, a MOML may be a Ternary MOML. The phrase "Ternary MOML" refers to a metal-organic mixed layer composed of three components; (i) a metal material, (ii) an organic compound, and (iii) an additional third component (different from the other two components), which can be a metal, an organic material or an inorganic material. Exemplary embodiments of a Ternary MOML include, but are not limited to, a MOML of Binary MOML such as, for example, embodiments above and further including a Group 1 metal (also sometimes called an alkali metal) such as Li, Na, K, Rb or Cs or a compound thereof such as a Group 1 metal halide (e.g., fluoride, chloride, bromide, iodide), oxide, hydroxide, nitride or sulfide; a MOML of Binary MOML such as, for example, embodiments above and further comprising a Group 2 metal (also sometimes called alkaline earth metal) such as Be, Mg, Ca, Sr or Ba or a compound thereof such as a Group 2 metal halide (e.g. fluoride, chloride, bromide iodide), oxide, hydroxide, nitride, boride, or sulfide; a MOML composed of at least a metal material, an organic compound, and Ag or an Ag compound (e.g., a silver oxide, hydroxide, halide, sulfide, nitride, carbide, boride, and the like); a MOML composed of (i) a metal material, (ii) organic compound, and (iii) Zn, In or Sn or compounds thereof (e.g., ZnO, ZnS, $In_2O_3$, $SnO_2$); a MOML composed of at least an organic compound and an alloy composed of a plurality of metals such as, for example, INCONEL™; a MOML composed of at least Al or an inorganic compound thereof (e.g., an oxide, hydroxide, halide, sulfide, nitride, carbide, boride, and the like), an organic compound, and any third component which can be another metal (e.g., Ag, a Group 1 metal, or a Group 2 metal) or compounds thereof; a MOML composed of (i) porphyrin, tertiary aromatic amine, indolocarbazole, polythiophene, PEDOT™ (which is a specific polythiophene) (ii) Ag or a compound thereof, and (iii) Au, Cr, Cu, Pt, In, Ni, Sn, or compounds thereof such as $In_2O_3$, $SnO_2$; and the like.

In still other embodiments, the MOML may be a Quaternary MOML. The phrase "Quaternary MOML" refers to a metal-organic mixed layer composed of four components; (i) a metal material, (ii) an organic material, (iii) an additional third component, and (iv) an additional fourth component. The additional third and fourth components (which are different from each other and different from the first and second components) can be metals, organic materials, or inorganic materials. Exemplary embodiments of Quaternary MOML include; but are not limited to a MOML composed of an organic compound, Ag, Mg, and a Group 1 metal (e.g., Li) or a compound thereof (e.g., LiF); a MOML composed of an organic compound, Ag, Ca, and a Group 1 metal (e.g., Li) or a compound thereof (e.g., LiF); a MOML composed of an organic compound, Ag, Ca, and another Group 2 metal (e.g., Mg) or a compound thereof (e.g., $MgF_2$ or MgO); a MOML composed of an organic compound, Ag, Al, and a Group 1 metal (e.g., Li) or a compound thereof (e.g., LiF), or a Group 2 metal (e.g., Ca or Mg) or a compound thereof; and the like.

The MOML, in embodiments, possesses a generally uniform composition across the entire MOML thickness. To achieve the generally uniform composition, the MOML can be prepared by using a "controlled mixing ratio method" (e.g., spin coating and co-deposition). Thus, in embodiments, the MOML is a mixture of a controlled composition, in the sense that the mixing ratio of the different components is controlled to certain levels by means of controlling for instance the evaporation rate of each of the different components which are evaporated from separate evaporation sources simultaneously. In embodiments, the ratios of the different components in the MOML generally stay the same and do not change with time (i.e., ratios of the components in the MOML if measured immediately after fabrication will be equal to their ratios a few days later and longer).

In other embodiments, the MOML may have a non-uniform composition across the entire MOML thickness. Co-deposition can be used to produce the non-uniform composition of the MOML (e.g., by varying the co-deposition rates of the MOML materials during formation of the MOML). Due to intra-layer diffusion or inter-layer diffusion, there may occur in certain embodiments of the MOML a change from a generally uniform composition (when prepared by a "controlled mixing ratio method") to a non-uniform composition over long periods of time. In addition, inter-layer diffusion of materials can be used to prepare the MOML. Diffusion is a less preferred approach for fabricating the MOML for the following reasons; (a) diffusion may require significant time (days, weeks, months, or longer); (b) the mixing ratio changes with time; and (c) one has less control over the desired ratio of MOML materials.

In embodiments, adjacent MOMLs composed of the same components but in different concentrations are viewed to be distinct MOMLs rather than a single MOML with a non-uniform composition if the concentration of one of the components changes by at least 5% over a distance of no more than 5 nm in a direction parallel to the thickness of the MOMLs measured during or immediately after the MOMLs fabrication.

In some embodiments, the MOML is generally electrically conductive. An electrically conductive MOML can have a cross-sectional (i.e., across the MOML thickness) ohmic resistance not exceeding, for example, about 100,000 Ohms, and particularly, not exceeding about 5,000 Ohms, and preferably not exceeding 1,000 Ohms. In other embodiments, however, the MOML may be considered electrically non-conductive, e.g., possessing an ohmic resistance value somewhere higher than the illustrative range described herein.

In this regard, the MOML can be partially or fully light absorbing, partially or fully light-transmissive, or partially or fully light-reflective. A partially or fully light absorbing MOML, can, for example, have an optical density of at least 0.1 and typically the optical density is at least 0.5, and more typically, the optical density is at least 1.0 over at least a part of the visible light range (i.e. electromagnetic radiation in the range 400-700 nm). A partially or fully transmissive (transparent) MOML in general can—for example—have a transmittance of at least 50% and typically a transmittance of at least 75% over at least a part of the visible light range (i.e. electromagnetic radiation in the range 400-700 nm). A partially or fully light-reflective MOML can—for example—have a reflectivity of at least 50%, and typically, a reflectivity of at least 75% over at least a part of the visible light range (i.e. electromagnetic radiation in the range 400-700 nm).

The MOML generally comprises the metal material in an amount of from about 5 to about 95 percent by volume of the MOML, and the organic compound in an amount of from about 5 to about 95 percent by volume of the MOML. In other embodiments, the MOML comprises a metal material in an amount of from about 20 to about 80 percent by volume and an organic compound in an amount of from about 20 to about 80 percent by volume of the MOML.

The electron-accepting material employed in an anode configuration in accordance with the present disclosure is generally an oxidizing agent capable of oxidizing an organic compound used in the luminescent region of a display device. An example of a suitable electron-accepting material is a Lewis aid compound. Examples of Lewis acid compounds suitable as the electron-accepting material include those disclosed in U.S. Pat. No. 6,423,429 to Kido, et al., such as, for example, $FeCl_3$, $AlCl_3$, $InCl_3$, $GaCl_3$, $SbCl_5$, and the like. Other suitable electron-accepting materials include organic compounds such as, for example, trinitrofluorenone, and 2,3,5,6-tetrafluoro-7,7,8,8-tetracyanoquinodimethane ($F_4$-TCNQ).

As previously described, the anode comprises a MOML operatively combined with an electron-accepting material. A MOML may be operatively combined with an electron-accepting material by including the electron-accepting material as part of the MOML mixture, or by providing the MOML and the electron-accepting material in separate, adjacent layers.

In embodiments where the anode comprises a mixture of a MOML and an electron-accepting material, the MOML is present in an amount of from about 5 to about 95 percent by volume of the anode layer, and the electron-accepting material is present in an amount of from about 5 to about 95 percent by volume of the anode.

In one embodiment the buffer layer of an anode in a display device in accordance with the present disclosure, consists of an electron-accepting material or combination of electron-accepting materials. In other embodiments, the buffer layer may include a mixture of an electron-accepting material and an organic material, such as a hole transport material.

Examples of hole transport materials suitable for use in a buffer layer with an electron-accepting material include hole transport materials described herein. Some specific examples of hole transport materials suitable for use in an anode buffer layer include, but are not limited to, N,N'-di(naphthalene-1-yl)-N,N'-diphenyl-bendidine (NPB), 4,4'4"-tris(N,N-diphenylamino)triphenylamine (mTDATA), 2,5-di-tert-butylphenyl-N,N'-diphenyl-N,N'bis(3-methylphenyl-(1,1'-biphenyl)-4,4'-diamine (BP-TPD), N,N'-diphenyl-N,N'-bis(3) methylphenyl-(1,1'-biphenyl)-4,4'-diamine (TPD), copper phthalocyanine (CuPc), vanadyl-phthalocyanine (VOPc), poly(3,4-ethylenedioxythiophene) (PEDOT), polyaniline (PAni), and the like, and combinations thereof. Where the buffer layer comprises a mixture of an electron-accepting material and a hole-transport material, the electron-accepting material is present in an amount of from about 1 to about 99 percent by volume and the hole transport material is present in an amount of from about 99 to about 1 percent by volume, and typically, the electron-accepting material is present in an amount of from about 5 to about 50 percent by volume and the hole transport material is present in an amount of from about 95 to about 50 percent by volume.

The anode buffer layer or region (e.g., buffer layer 25 in FIG. 2) may be a single layer or multi-layer configuration comprising 2, 3, or more layers. In a multi-layer configuration, at least the buffer layer adjacent the MOML comprises an electron-accepting material. The composition of the buffer layers may be selected as desired for a particular purpose or intended use. For example, in an anode comprising a MOML and a buffer layer comprising a first buffer layer and a second buffer layer, each of the first and second buffer layers may consist of an electron-accepting material. In another embodiment, the first buffer layer may consist of an electron-accepting material and the second buffer layer may comprise an electron-accepting material and a hole transport material. In a further embodiment, the first buffer layer may comprise an electron-accepting material and a hole transport material. In still another embodiment, each of the first and second buffer layers comprise an electron-accepting material and a hole transport material. Other embodiments and configurations are possible and within the scope of an anode in accordance with the present disclosure.

The thickness of the anode may be from about 100 to about 5000 angstroms. In embodiments, the anode has a thickness of from about 150 to about 2,000 angstroms. In embodiments in which the anode comprises a MOML and a separate buffer layer or comprising an electron-accepting material, the buffer layer may have a total thickness of from about 10 to about 500 angstroms. Individual layers of a multi-layer buffer layer configuration may have a thickness of from about 1 to about 9 nm. In embodiments, the buffer layer has a total thickness of from about 50 to about 300 angstroms.

The properties of the anode and/or the display device may be tuned or adjusted as desired to form a display device having a desired property for a particular purpose or intended use. For example, the electrical properties of the device may be selected or varied by varying the composition of one of the MOML, or the concentrations of the metal material and the organic material in the MOML and/or the concentration of the electron-accepting material. Additionally, the light-absorbing, transmission or reflective ability of the anode and/or the display device may be adjusted by varying one or both of the thickness of the MOML and the metal concentration of the MOML. Generally, as the thickness and/or the metal concentration is increased, the MOML becomes less transparent, more absorbing or more reflective. In one embodiment, the anode and the display device are substantially transparent. In another embodiment, a display device in accordance with the present disclosure reduces light reflection by at least about 30 percent compared to a display device without any MOML. In another embodiment, a device in accordance with the present disclosure reduces light reflection by at least about 50 percent as compared to any display device without any MOML. In other embodiments, a display device in accordance with the present disclosure has a Sun/Eye-weighted Integrated Reflectivity (SEIR) of less than about 75 percent. In further embodiments, a display device has a SEIR of less than about 50 percent. In still even further embodiments, a display device exhibits a SEIR of less than about 20 percent.

Embodiments of a display device in accordance with the present disclosure encompass the use of one or more MOMLs in any kind of OLEDs, including molecular (small-molecule)-based OLEDs, polymer-based OLEDs, or hybrid OLEDs containing both molecular and polymeric materials in the luminescent region. MOMLs also can be applied to hybrid OLEDs composed of both organic and inorganic materials in the luminescent region. Furthermore, types of display devices encompassed within the present disclosure include OLEDs, inorganic electroluminescent or phosphor devices, liquid crystal displays, plasma displays, and the like.

Any suitable technique and apparatus can be used to form the anode and/or the MOMLs and the buffer layer. For example, there may be employed thermal deposition (i.e., physical vapor deposition—"PVD"), spin-coating, sputtering, electron beam, electric arc, chemical vapor deposition ("CVD"), and the like. The first two techniques, and PVD in particular, may be the more desirable approaches. In the case of PVD, the MOML can be formed by means of for example co-evaporating the components of the MOML and the electron-accepting material, with the deposition rate of each of the materials independently controlled to achieve the desired mixing ratio. Certain ranges of mixing ratio of the different components are more effective in producing the desired characteristics in the MOML. These preferred mixing ratios may be determined on a trial and error basis for specific material combinations. Generally speaking, in embodiments comprising a mixture of an MOML and an electron-accepting material, the anode can comprise the MOML in an amount of from about 5 to about 95 percent by volume and the electron-accepting material may be present in an amount comprised from about 95 to about 5 percent by volume of the anode. More preferred ranges will depend on the particular materials selected. The phrase "controlled mixing ratio method" refers to spin-coating and co-deposition. Co-deposition refers to thermal deposition (i.e., physical vapor deposition—"PVD"), sputtering, electron beam, electric arc, chemical vapor deposition ("CVD"), and the like.

Further, these techniques, including paper deposition, are also suitable for forming the buffer layer comprising an electron-accepting material and optional hole transport material in embodiments where the MOML and electron-accepting material are in separate adjacent layers of the anode (such as, e.g., in FIG. 2).

The combination of a MOML and an electron-accepting material, whether combined in a mixture or in separate, adjacent layers, overcomes some of the difficulties associated with employing an MOML as an anode. The ability to use an MOML as an anode also allows for the use of deposition techniques that are not available with conventional anode materials, such as ITO. The use of an MOML in an anode also allows the reflectance of a display device to be reduced and allows for the production of a black anode as a back electrode.

While not shown in the figures, it will be appreciated that a display device, such as the OLEDs of FIGS. 1-2, may include a substrate adjacent one of the electrodes, i.e., adjacent one of the anode or the cathode. A substantially transparent substrate can comprise various suitable materials including, for example, polymeric components, glass, quartz and the like. Suitable polymeric components include, but are not limited to polyesters such as MYLAR®, polycarbonates, polyacrylates, polymethacrylates, polysulfones, and the like. Other substrate materials can also be selected provided, for example, that the materials can effectively support the other layers, and do not interfere with the device functional performance.

An opaque substrate can comprise various suitable materials including, for example, polymeric components like polyesters such as MYLAR®, polycarbonates, polyacrylates, polymethacrylates, polysulfones, and the like, which contain coloring agents or dyes such as carbon black. The substrate can also be comprised of silicon such as amorphous silicon, polycrystalline silicon, single crystal silicon, and the like. Another class of materials that can be used in the substrate are ceramics such as metallic compounds like metal oxides, metal halides, metal hydroxides, metal sulfides and others.

In embodiments, the substrate may have a thickness ranging for example from about 10 to about 5,000 micrometers. In other embodiments, the substrate may have a thickness of from about 25 to about 1,000 micrometers.

A cathode can comprise suitable electron injecting materials, such as metals, including high work function components, such as metals with, for example, a work function from about 4 eV to about 6 eV, or low work function components, such as metals with, for example, a work function of from about 2 eV to about 4 eV. The cathode can comprise a combination of a low work function (less than about 4 eV) metal and at least one other metal. Effective proportions of the low work function metal to the second or other metal are from less than about 0.1 weight percent to about 99.9 weight percent. Illustrative examples of low work function metals include, but are not limited to, alkaline metals such as lithium or sodium; Group 2A or alkaline earth metals such as beryllium, magnesium, calcium or barium; and Group III metals including rare earth metals and the actinide group metals such as scandium, yttrium, lanthanum, cerium, europium, terbium or actinium. Lithium, magnesium and calcium are exemplary low work function metals. Materials suitable for forming the cathode include, but are not limited to, the Mg—Ag alloy cathodes described in U.S. Pat. Nos. 4,885,211, 4,720,432, and 5,703,436, the disclosures of which are totally incorporated herein by reference. Other suitable cathodes comprise a metal-organic mixed later (MOML) as disclosed in, for example, U.S. Pat. No. 6,841,932, which is incorporated herein by reference in its entirety, and in U.S. Pat. No. 5,429,884, the disclosure of which is totally incorporated herein by reference. The cathodes can also be formed from lithium alloys with other high work function metals such as aluminum and indium.

A substantially transparent cathode can comprise very thin substantially transparent metallic layers comprising a metal with a work function ranging from about 2 eV to about 4 eV, such as Mg, Ag, Al, Ca, In, Li and their alloys such as Mg:Ag alloys, comprised of, for example, from about 80 to 95 volume percent of Mg and about 20 to about 5 volume percent of Ag, and Li:Al alloys, comprised of, for example, from about 90 to 99 volume percent of Al, and from about 10 to about 1 volume percent of Li, and the like, having a thickness, for example, from about 10 angstroms to about 200 angstroms, and, in embodiments, from about 30 angstroms to about 100 angstroms. Of course, a thickness outside of this range can also be used.

In embodiments wherein the cathode is a MOML, the cathodes may comprise one or more additional layers. The one or more additional layer(s) of the cathodes can comprise at least one metal and/or at least one inorganic material. Suitable exemplary metals that can be used in the additional layer(s) include, but are not limited to, Mg, Ag, Al, In, Ca, Sr, Au, Li, Cr and mixtures thereof. Suitable exemplary inorganic materials that can be used in the additional layer(s) include, but are not limited to, SiO, $SiO_2$, LiF, $MgF_2$ and mixtures thereof.

The one or more additional layer(s) can have the same or different functions from each other. For example, one or more additional layers of the cathode can comprise, or can consist essentially of, a metal to form a conductive layer with a low sheet resistance (e.g., <10Ω/square). In addition, one or more additional layers of the cathode can protect the metal-organic mixed layer from the ambient by forming a passivating layer (such as, for example, a moisture barrier) that prevents, or at least reduces, the permeation of ambient moisture to the MOML, the luminescent region and the anode. Also, one or more additional layers of the cathode can act as a thermal protective layer to provide protection from device shorting at elevated temperatures. For example, such protection can be provided at temperatures ranging from about 60° C. to about 110° C., as discussed in more detail in U.S. Pat. No. 6,765,348, which is incorporated herein by reference in its entirety.

The thickness of the cathode can range from, for example, about 10 nanometers (nm) to about 1,000 nanometers. Thicknesses outside of this range can also be used.

The cathode may be a single layer or may comprise two, three or more layers. For instance, the electrode may be composed of a charge injection layer (i.e., an electron injection layer or a hole injection layer) and a capping layer. In embodiments, however, the charge injection layer may be considered distinct from the electrode.

The luminescent region of a display device in accordance with the present disclosure comprises, in embodiments, at least one electroluminescent organic material. The type of electroluminescent material is not critical and may be any material suitable for use as an electroluminescent material in a display device. Suitable organic electroluminescent materials include, for example, polyphenylenevinylenes, such as poly(p-phenylenevinylene) PPV, poly(2-methoxy-5-(2-ethylhexyloxy) 1,4-phenylenevinylene) (MEHPPV) and poly(2,5-dialkoxyphenylenevinylene) (PDMeOPV), and other materials disclosed in U.S. Pat. No. 5,247,190, which is incorporated herein by reference in its entirety; polyphenylenes, such as poly(p-phenylene) (PPP), ladder-poly-paraphenylene (LPPP), and poly(tetrahydropyrene) (PTHP); and polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers (see e.g., Bemius et al., "Developmental Progress of Electroluminescent Polymeric Materials and Devices," Proceedings of SPIE Conference on Organic Light Emitting Materials and Devices III, Denver, Colo., July 1999, Volume 3797, p. 129).

Another class of organic electroluminescent materials that can be utilized in the luminescent region includes, but is not limited to, the metal oxinoid compounds as disclosed in U.S. Pat. Nos. 4,539,507; 5,151,629; 5,150,006; 5,141,671 and 5,846,666, each incorporated herein by reference in its entirety. Illustrative examples include tris(8-hydroxyquinolinate)aluminum (AlQ3), and bis(8-hydroxyquinolato)-(4-phenylphenolato)aluminum (BAlq). Other examples of this class of materials include tris(8-hydroxyquinolinate)gallium, bis(8-hydroxyquinolinate)magnesium, bis(8-hydroxyquinolinate)zinc, tris(5-methyl-8-hydroxyquinolinate)aluminum, tris(7-propyl-8-quinolinolato)aluminum, bis[benzo{f}8-quinolinate]zinc, bis(10-hydroxybenzo[h]quinolinate)beryllium, and the like, and metal thioxinoid compounds disclosed in U.S. Pat. No. 5,846,666 (which is incorporated herein by reference in its entirety), such as metal thioxinoid compounds of bis(8-quinolinethiolato)zinc, bis(8-quinolinethiolato)cadmium, tris(8-quinolinethiolato)gallium, tris(8-quinolinethiolato)indium, bis(5-methylquinolinethiolato)zinc, tris(5-methylquinolinethiolato)gallium, tris(5-methylquinolinethiolato)indium, bis(5-methylquinolinethiolato)cadmium, bis(3-methylquinolinethiolato)cadmium, bis(5-methylquinolinethiolato)zinc, bis[benzo{f}-[8-quinolinethiolato]zinc, bis[3-methylbenzo{f}-8-quinolinethiolato]zinc, bis[3,7-dimethylbenzo{f}-8-quinolinethiolato]zinc, and the like. A further class of organic electroluminescent materials that can be used in the luminescent region comprises stilbene derivatives, such as those disclosed in U.S. Pat. No. 5,516,577, incorporated herein by reference in it entirety. A non-limiting example of a suitable stilbene derivative is 4,4'-bis(2,2-diphenylvinyl)biphenyl. Another class of organic electroluminescent materials that can be used in the luminescent region comprises anthracenes, such as, for example 2-t-butyl-9,10-di-(2-naphthyl) anthracene, 9,10-di-(2-naphthyl) anthracene, 9,10-di-phenyl anthracene, 9,9-bis[4-(9-anthryl)phenyl]fluorine, and 9,9-bis [4-(10-phenyl-9-anthryl)phenyl]fluorine. Other suitable anthracenes are disclosed in U.S. application Ser. No. 09/208, 172, now U.S. Pat. No. 6,465,115 (corresponding to EP 1009044 A2), those disclosed in U.S. Pat. No. 5,972,247, and U.S. application Ser. No. 09/771,311, now U.S. Pat. No. 6,479,172, and those disclosed in U.S. Pat. No. 5,935,721, the disclosures of which are totally incorporated herein by reference.

Another class of suitable organic electroluminescent materials suitable for use in the luminescent region is the oxadiazole metal chelates disclosed in U.S. Pat. No. 5,925,472, which is incorporated herein by reference in its entirety. These materials include bis[2-(2-hydroxyphenyl)-5-phenyl-1,3,4-oxadiazolato]zinc; bis[2-(2-hydroxyphenyl)-5-phenyl-1,3,4-oxadiazolato]beryllium; bis[2-(2-hydroxyphenyl)-5-(1-naphthyl)-1,3,4-oxadiazolato]zinc; bis[2-(2-hydroxyphenyl)-5-(1-naphthyl)-1,3,4-oxadiazolato] beryllium; bis[5-biphenyl-2-(2-hydroxyphenyl)-1,3,4-oxadiazolato]zinc; bis[5-biphenyl-2-(2-hydroxyphenyl)-1,3, 4-oxadiazolato]beryllium; bis(2-hydroxyphenyl)-5-phenyl-1,3,4-oxadiazolato]lithium; bis[2-(2-hydroxyphenyl)-5-p-tolyl-1,3,4-oxadiazolato]zinc; bis[2-(2-hydroxyphenyl)-5-p-tolyl-1,3,4-oxadiazolato]beryllium; bis[5-(p-tert-butylphenyl)-2-(2-hydroxyphenyl)-1,3,4-oxadiazolato]zinc; bis[5-(p-tert-butylphenyl)-2-(2-hydroxyphenyl)-1,3,4-oxadiazolato]beryllium; bis[2-(2-hydroxyphenyl)-5-(3-fluorophenyl)-1,3,4-oxadiazolato]zinc; bis[2-(2-hydroxyphenyl)-5-(4-fluorophenyl)-1,3,4-oxadiazolato]zinc; bis[2-(2-hydroxyphenyl)-5-(4-fluoro-phenyl)-1,3,4-oxadiazolato] beryllium; bis[5-(4-chlorophenyl)-2-(2-hydroxyphenyl)-1,3, 4-oxadiazolato]zinc; bis[2-(2-hydroxyphenyl)-5-(4-methoxyphenyl)-1,3,4-oxadiazolato]zinc; bis[2-(2-hydroxy-4-methylphenyl)-5-phenyl-1,3,4-oxadiazolato]zinc; bis[2-(2-hydroxynaphthyl)-5-phenyl-1,3,4-oxadiazolato]zinc; bis [2-(2-hydroxyphenyl)-5-p-pyridyl-1,3,4-oxadiazolato]zinc; bis[2-(2-hydroxyphenyl)-5-p-pyridyl-1,3,4-oxadiazolato] beryllium; bis[2-(2-hydroxyphenyl)-5-(2-thiophenyl)-1,3,4-oxadiazolato]zinc; bis[2-(2-hydroxyphenyl)-5-phenyl-1,3,4-thiadiazolato]zinc; bis[2-(2-hydroxyphenyl)-5-phenyl-1,3,4-thiadiazolato]beryllium; bis[2-(2-hydroxyphenyl)-5-(1-naphthyl)-1,3,4-thiadiazolato]zinc; and bis[2-(2-hydroxyphenyl)-5-(1-naphthyl)-1,3,4-thiadiazolato] beryllium, and the like; and the triazines including those disclosed in U.S. Pat. Nos. 6,057,048 and 6,821,643, each of which is incorporated herein by reference in its entirety.

The luminescent region can further include from about 0.01 weight percent to about 25 weight percent of a luminescent material as a dopant. Examples of dopant materials that can be utilized in the luminescent region are fluorescent materials, such as, for example, coumarin, dicyanomethylene pyranes, polymethine, oxabenzanthrane, xanthene, pyrylium, carbostyl, perylene, and the like. Another suitable class of fluorescent materials are quinacridone dyes. Illustrative examples of quinacridone dyes include quinacridone, 2-methylquinacridone, 2,9-dimethylquinacridone, 2-chloroquinacridone, 2-fluoroquinacridone, 1,2-benzoquinacridone, N,N'-dimethylquinacridone, N,N'-dimethyl-2-methylquinacridone, N,N'-dimethyl-2,9-dimethylquinacridone, N,N'-dimethyl-2-chloroquinacridone, N,N'-dimethyl-2-fluoroquinacridone, N,N'-dimethyl-1,2-benzoquinacridone, and the like as disclosed in U.S. Pat. Nos. 5,227,252; 5,276,381; and 5,593,788, each incorporated herein in its entirety. Another class of fluorescent materials that may be used is fused ring fluorescent dyes. Exemplary suitable fused ring fluorescent dyes include perylene, rubrene, anthracene, coronene, phenanthrecene, pyrene and the like, as disclosed in U.S. Pat. No. 3,172,862, which is incorporated herein by reference in its entirety. Also, fluorescent materials include butadienes, such as 1,4-diphenylbutadiene and tetraphenylbutadiene, and stilbenes, and the like, as disclosed in U.S. Pat. Nos. 4,356,429 and 5,516,577, each incorporated herein by reference in its entirety. Other examples of fluorescent materials that can be used are those disclosed in U.S. Pat. No. 5,601,903, which is incorporated herein by reference in its entirety.

Additionally, luminescent dopants that can be utilized in the light luminescent region are the fluorescent dyes disclosed in U.S. Pat. No. 5,935,720 (which is incorporated herein by reference in its entirety), such as, for example, 4-(dicyanomethylene)-2-1-propyl-6-(1,1,7,7-tetramethyljulolidyl-9-enyl)-4H-pyran (DCJTB); the lanthanide metal chelate complexes, such as for example, tris(acetyl acetonato) (phenanthroline) terbium, tris(acetyl acetonato)(phenanthroline) europium, and tris(thenoyl trisfluoroacetonato)(phenanthroline) europium, and those disclosed in Kido et al., "White light emitting organic electroluminescent device using lanthanide complexes," Jpn. J. Appl. Phys., Volume 35, pp. L394-L396 (1996), which is incorporated herein by reference in its entirety; and phosphorescent materials, such as, for example, organometallic compounds containing heavy metal atoms that lead to strong spin-orbit coupling, such as those disclosed in Baldo et. al., "Highly efficient organic phosphorescent emission from organic electroluminescent devices," Letters to Nature, Volume 395, pp. 151-154 (1998), which is incorporated herein by reference in its entirety. Preferred examples include 2,3,7,8,12,13,17,18-octaethyl-21H23H-phorpine platinum(II) (PtOEP) and fac tris(2-phenylpyridine)iridium (Ir(ppy)3).

The luminescent region can also include one or more materials with hole-transporting properties. Examples of hole-transporting materials that can be utilized in the luminescent region include polypyrrole, polyaniline, poly(phenylene vinylene), polythiophene, polyarylamine as disclosed in U.S. Pat. No. 5,728,801, which is incorporated herein by reference in its entirety, and their derivatives, and known semiconductive organic materials; porphyrin derivatives such as 1,10,15, 20-tetraphenyl-21H,23H-porphyrin copper (II) disclosed in U.S. Pat. No. 4,356,429, incorporated herein by reference in its entirety; copper phthalocyanine; copper tetramethyl phthalocyanine; zinc phthalocyanine; titanium oxide phthalocyanine; magnesium phthalocyanine; and the like.

A specific class of hole transporting materials that can be utilized in the luminescent region are the aromatic tertiary amines such as those disclosed in U.S. Pat. No. 4,539,507, which is incorporated herein by reference in its entirety. Suitable exemplary aromatic tertiary amines include, but are not limited to, bis(4-dimethylamino-2-methylphenyl)phenylmethane; N,N,N-tri(p-tolyl)amine; 1,1-bis(4-di-p-tolylaminophenyl)cyclohexane; 1,1-bis(4-di-p-tolylaminophenyl)$_4$-phenyl cyclohexane; N,N'-diphenyl-N,N'-bis(3-methylphenyl)-1,1'-biphenyl-4,4'-diamine; N,N'-diphenyl-N,N'-bis(3-methylphenyl)-1,1'-biphenyl-4,4'-diamine; N,N'-diphenyl-N,N'-bis(4-methoxyphenyl)-1,1'-biphenyl-4,4'-diamine; N,N,N',N'-tetra-p-tolyl-1,1'-biphenyl-4,4'-diamine; N,N'-di-1-naphthyl-N,N'-diphenyl-1,1'-biphenyl-4,4'-diamine; N,N'-di(naphthalene-1-yl)-N,N'-diphenyl-benzidine ("NPB"); mixtures thereof and the like. Another class of aromatic tertiary amines are polynuclear aromatic amines. Examples of these polynuclear aromatic amines include, but are not limited to, N,N-bis-[4'-(N-phenyl-N-m-tolylamino)-4-biphenylyl]-aniline; N,N-bis-[4'-(N-phenyl-N-m-tolylamino)-4-biphenylyl]-m-toluidine; N,N-bis-[4'-(N-phenyl-N-m-tolylamino)-4-biphenylyl]-p-toluidine; N,N-bis-[4'-(N-phenyl-N-p-tolylamino)-4-biphenylyl]aniline; N,N-bis-[4'-(N-phenyl-N-p-tolylamino)-4-biphenylyl]-m-toluidine; N,N-bis-[4'-(N-phenyl-N-p-tolylamino)-4-biphenylyl]-p-toluidine; N,N-bis-[4'-(N-phenyl-N-p-chloro-phenylamino)-4-biphenylyl]-m-toluidine; N,N-bis-[4'-(N-phenyl-N-m-chlorophenyl-amino)-4-biphenylyl]-m-toluidine; N,N-bis-[4'-(N-phenyl-N-m-chlorophenylamino)-4-biphenylyl]-p-toluidine; N,N-bis-[4'-(N-phenyl-N-m-tolylamino)4-biphenylyl]-p-chloroaniline; N,N-bis-[4'-(N-phenyl-N-p-tolylamino)-4-biphenylyl]-m-chloroaniline; N,N-bis-[4'-(N-phenyl-N-m-tolylamino)-4-biphenylyl]-1-aminonaphthalene, mixtures thereof and the like; 4,4'-bis(9-carbazolyl)-1,1'-biphenyl compounds, such as, for example 4,4'-bis(9-carbazolyl)-1,1'-biphenyl and 4,4'-bis(3-methyl-9-carbazolyl)-1,1'-biphenyl, and the like.

A specific class of the hole transporting materials that can be used in the luminescent region are the indolo-carabazoles, such as those disclosed in U.S. Pat. Nos. 5,942,340 and 5,952,115, each incorporated herein by reference in its entirety, such as, for example, 5,11-di-naphthyl-5,11-dihydroindolo[3,2-b] carbazole, and 2,8-dimethyl-5,11-di-naphthyl-5,11-dihydroindolo[3,2-b]carbazole; N,N,N'N'-tetraaryl-benzidines, wherein aryl may be selected from phenyl, m-tolyl, p-tolyl, m-methoxyphenyl, p-methoxyphenyl, 1-naphthyl, 2-naphthyl and the like. Illustrative examples of N,N,N'N'-tetraaryl-benzidine are N,N,-di-1-naphthyl-N,N'-diphenyl-1,1'-biphenyl-4,4'-diamine; N,N'-bis(3-methylphenyl)-N,N'-diphenyl-1,1'-biphenyl-4,4'-diamine; N,N'-bis(3-methoxyphenyl)-N,N'-diphenyl-1,1'-biphenyl-4,4'-diamine, and the like. Suitable hole transporting materials that can be used in the luminescent region are the naphtyl-substituted benzidine derivatives.

The luminescent region can also include one or more materials with electron transporting properties. An example of electron transporting materials that can be utilized in the luminescent region is polyfluorenes, such as poly(9,9-di-n-octylfluorene-2,7-diyl), poly(2,8-(6,7,12,12-tetraalkylindenofluorene) and copolymers containing fluorenes such as fluorene-amine copolymers, as disclosed in incorporated Bernius et al., Proceedings of SPIE Conference on Organic Light Emitting Materials and Devices Ill., Denver, Colo., July 1999, Volume 3797, p. 129.

Other examples of electron transporting materials that can be utilized in the luminescent region can be selected from the metal oxinoid compounds, the oxadiazole metal chelate compounds, the triazine compounds and the stilbene compounds, examples of which have been described above in detail.

In embodiments where the luminescent region includes one or more hole transport material and/or one or more electron transport material in addition to the organic electroluminescent material(s), the organic electroluminescent material, the hole transport material(s), and/or the electron transport material(s) can be formed in separate layers, such as, for example, the OLEDs disclosed in U.S. Pat. Nos. 4,539,507; 4,720,432 and 4,769,292; or in the same layer thus forming mixed zones of two or more materials, such as, for example, the OLEDs disclosed in U.S. Pat. Nos. 6,130,001; 6,392,339; 6,392,250, and 6,614,175. The disclosures of these patents and patent applications are incorporated herein by reference in their entirety.

Additionally, the luminescent region may include a MOML as described in U.S. Pat. No. 6,841,932 and application Ser. No. 10/401,238, which is published as U.S. Pat. Application No. 2003/0234609, each of which are incorporated herein by reference in their entirety.

The thickness of the luminescent region can vary from, for example, about 1 nm to about 1000 nm. In embodiments, the thickness of the luminescent region is from about 20 nm to about 200 nm, and, in other embodiments, from about 50 nm to about 150 nm.

A display device comprising an anode in accordance with the present disclosure is further described with reference to the following examples. The examples are merely intended to further illustrate an anode configuration in accordance with the present disclosure and are not intended to be limiting embodiments thereof.

EXAMPLES

Examples 1-16

Examples 1-16 in Table 1 below summarize OLED devices that have been reduced to practice. All devices were fabricated using physical vapor deposition in vacuum ($5 \times 10^{-6}$ Torr). Table 1 indicates the anode configure used in the respective OLED devices. The luminescent region of the devices was composed of two layers; (i) a 600 angstrom NPB layer functioning as a hole transport zone, and (ii) a 750 angstrom AlQ3 layer serving the dual functions of light emission and electron transport. The cathode was formed with Mg:Ag. The NPB, AlQ3 and cathode layers were sequentially deposited following deposition of the anode layer. In samples 1-5, the anode had a configuration comprising a MOML and a buffer layer deposited over the MOML, wherein the buffer layer was a single layer entirely composed of an electron-accepting material. In examples 6-8, the anode comprised a MOML and a single layer buffer layer disposed over the MOML, the buffer layer configuration comprising an electron-accepting material and a hole transport material. In examples 9-11, the anode comprises a MOML and a multi-layer buffer configuration disposed over the MOML. The electron-accepting material may be present in one or both of the layers of the multilayer buffer configuration. In example 12, the anode comprises a single layer comprising a mixture of a MOML and an electron-accepting material, i.e., without any additional buffer layer. Examples 13-16 are comparative examples using either a convention anode material (i.e., ITO) or comprise a MOML or MOML/buffer configuration without any electron-accepting material.

Table 1 shows the OLED driving voltage at 25 mA/cm² and demonstrates that anodes in accordance with the present disclosure can provide suitable hole-injection properties comparable to conventional anodes.

TABLE 1

| Example No. | Anode Configuration | V@25 mA/cm² |
|---|---|---|
| 1 | AIQ3(90%) + Ag(10%)(150 Å)/F4-TCNQ(50 Å) | 7 |
| 2 | AIQ3(90%) + Ag(10%)(500 Å)/F4-TCNQ(50 Å) | 7 |
| 3 | AIQ3(80%) + Ag(20%)(1000 Å)/F4-TCNQ(50 Å) | 7 |
| 4 | AIQ3(80%) + Ag(20%)(2000 Å)/F4-TCNQ(50 Å) | 7 |
| 5 | AIQ3(80%) + Ag(20%)(500 Å)/F4-TCNQ(50 Å) | 7.4 |
| 6 | AIQ3(80%) + Ag(20%)(500 Å)/NPB +2% F4-TCNQ(200 Å) | 10.4 |
| 7 | AIQ3(80%) + Ag(20%)(500 Å)/NPB +10% F4-TCNQ(200 Å) | 7.2 |
| 8 | AIQ3(80%) + Ag(20%)(500 Å)/CuPc +2% F4-TCNQ(150 Å) | 9.12 |
| 9 | AIQ3(80%) + Ag(20%)(500 Å)/F4-TCNQ(50 A)/CuPC(150 Å) | 7.7 |
| 10 | AIQ3(80%) + Ag(20%)(500 Å)/F4-TCNQ(50 A)/NPB +2% F4-TCNQ(150 Å) | 7.4 |
| 11 | AIQ3(80%) + Ag(20%)(500 Å)/CuPc +2% F4-TCNQ(150 A)/NPB +2% F4-TCNQ(200 Å) | 8.6 |
| 12 | AIQ3(70%) + Ag(10%) + F4-TCNQ(20%) (300 Å) | 18 |
| 13 | ITO (1000 Å) | 6.9 |
| 14 | AIQ3(80%) + Ag(20%)(500 Å)/CuPc (150 Å) | 18.3 |
| 15 | AIQ3(80%) + Ag(20%)(500 Å)/mTDATA (150 Å) | 22 |
| 16 | AIQ3(80%) + Ag(20%)(500 Å) | 17 |

Examples 17-21

Examples 17-21 were prepared in the same manner as described with reference to examples 1-16 and include the anode configuration set forth in Table 2. Examples 18-21 comprise anode configurations in accordance with the present disclosure and example 17 is a comparative example comprising a conventional ITO anode. The concentration of the components of the MOML are given in parenthesis next to the respective components and the number in parenthesis refer to the layer thickness in angstroms. As show in Table 2, different optical properties ranging from substantially transparent (as indicated by large SEIR values) to light-absorbing or dark (as indicated by small SEIR values) can be achieved by simply varying the thickness or composition of the MOML.

TABLE 2

| Example No. | Anode Configuration | SEIR |
|---|---|---|
| 17 | ITO | 79.60% |
| 18 | AIQ3(90%) + Ag(10%)(150 Å)/F4-TCNQ(50 Å) | 72.50% |
| 19 | AIQ3(90%) + Ag(10%)(500 Å)/F4-TCNQ(50 Å) | 58.40% |
| 20 | AIQ3(80%) + Ag(20%)(1000 Å)/F4-TCNQ(50 Å) | 15.80% |
| 21 | AIQ3(80%) + Ag(20%)(2000 Å)/F4-TCNQ(50 Å) | 17.80% |

While particular embodiments have been described, alternatives, modifications, variations, improvements, and substantial equivalents that are or may be presently unforeseen may arise to applicants or others skilled in the art. Accordingly, the appended claims as filed and as they may be amended are intended to embrace all such alternatives, modifications variations, improvements, and substantial equivalents.

The invention claimed is;

1. An organic light emitting device comprising;
   an anode;
   a cathode; and
   a luminescent region comprising an organic electroluminescent material disposed between the anode and the cathode,
   wherein the anode consists of a metal-organic mixed layer comprising i) a metal material, ii) an organic material, and iii) an electron accepting material,
   wherein the electron-accepting material is selected from the group consisting of trinitrofluorenone, 2,3,5,6-tetrafluoro-7,7,8,8-tetracyanoquinodimethane and combinations thereof,
   wherein the electron-accepting material oxidizes an organic compound used in the luminescent region.

2. The device according to claim 1, further comprising a hole transport material selected from the group consisting of N,Ni-di(naphthalene-1-yl)-N,NI-diphenyl-benzidine (NPB), 4,4'4"-tris(N,N-diphenylamino)triphenylamine (mTDATA), 2,5-di-tert-butylphenyl-N,NI-diphenyl-N,N' bis(3-methylphenyl-(1,1Ibiphenyl)-4,4'-diamine (BP-TPD), N,N'-diphenyl-N,N1-bis(3)methylphenyl-(1,1'-biphenyl)-4,4'-diamine (TPD), copper phthalocyanine (CuPc), vanadylphthalocyanine (VOPc), poly(3,4-ethylenedioxythiophene (PEDOT), polyaniline (PAni), and combinations thereof.

3. The device according to claim 1, wherein the metal material comprises a metal selected from the group consisting of Li, Na, K, Rb, Cs, Be, Mg, Ca, Sr, Ba, Sc, Y, La, Ti, Zr, Hf, V, Nb, Ta, Cr, Mo, W, Mn, Tc, Fe, Ru, Os, Co, Rh, Ir, Ni, Pd, Pt, Cu, Ag, Au, Zn, Cd, B, Al, Ga, In, Sn, Pb, Sb, Bi, Se, Te, Ce, Nd, Sm, Eu, and combinations thereof.

4. The device according to claim 1, wherein the metal-organic mixed layer is present in an amount of from about 5 to about 95 volume percent by volume of the anode, and the electron-accepting material is present in an amount of from about 95 to about 5 percent by volume of the anode.

5. The device according to claim 1, wherein the anode has a thickness in the range of from about 100 to about 5,000 angstroms.

6. The device according to claim 1, wherein the anode is light-absorbing, and the metal-organic mixed layer is selected such that the device reduces light reflection by at least about 30%.

7. The device according to claim 1, wherein the anode is substantially transparent, and the metal-organic mixed layer is selected such that the anode light transmittance in the visible range is at least 50%.

8. The device according to claim 1, wherein the anode is substantially reflective, and the metal-organic mixed layer is selected such that the anode reflectance in the visible range is at least 50%.

9. A display device comprising the device of claim 1.

10. An organic light emitting device comprising;
   an anode;
   a cathode; and
   a luminescent region comprising an organic electroluminescent material disposed between the anode and the cathode,
   wherein the anode comprises a metal-organic mixed layer comprising a mixture of i) a metal material, ii) an organic material, iii) an electron-accepting material,
   wherein the metal-organic mixed layer is operatively combined with the electron-accepting material, and
   wherein the electron-accepting material is selected from the group consisting of $FeCl_3$, $AlCl_3$, $InCl_3$, $GaCl_3$, $SbCl_5$, trinitrofluorenone, 2,3,5,6-tetrafluoro-7,7,8,8-tetracyanoquinodimethane and combinations thereof.

* * * * *